United States Patent [19]

Nakamura

[11] Patent Number: 4,788,157
[45] Date of Patent: Nov. 29, 1988

[54] METHOD OF FABRICATING A THIN FILM TRANSISTOR

[75] Inventor: Takeshi Nakamura, Ebina, Japan

[73] Assignee: Fuji Xerox Co., Ltd., Tokyo, Japan

[21] Appl. No.: 43,424

[22] Filed: Apr. 28, 1987

[30] Foreign Application Priority Data

May 2, 1986 [JP] Japan .................. 61-102638

[51] Int. Cl.[4] .............................................. H01L 7/00
[52] U.S. Cl. ...................................... 437/046; 437/84; 437/101; 437/197; 437/914; 437/915; 437/944; 148/DIG. 1; 148/DIG. 100; 148/DIG. 150; 357/4; 357/23.7
[58] Field of Search ................. 29/590, 591; 357/23.7, 357/9, 41, 61, 67, 71, 4, 23.7; 148/DIG. 33, DIG. 62, DIG. 37, DIG. 1, 100, 150; 437/46, 84, 101, 197, 944

[56] References Cited

U.S. PATENT DOCUMENTS

| | | | |
|---|---|---|---|
| 3,740,835 | 6/1973 | Duncan | 29/590 |
| 3,918,149 | 11/1975 | Roberts | 29/590 |
| 4,109,372 | 8/1978 | Geffken | 29/590 |
| 4,482,394 | 11/1984 | Heinecke | 29/576 B |
| 4,648,175 | 3/1987 | Metz, Jr. et al. | 29/591 |

OTHER PUBLICATIONS

Ondris et al., "Hydrogenated Amorphous Silicon Schottky-Barrier Diodes", 2nd E.C. Photovoltaic Solar Energy Conference, Proc. of International Conference, held at Berlin (West), 23-26, Apr. 1979, pp. 320-325.
Ondris et al., "Hydrogenated A-Si Multi-Junction Solar Cells and Interference Effects in the Spectral Response", Third E.C. Photovoltaic Solar Energy Conf., Proc. of the International Conf., held at Cannes, France, 27-31, Oct. 1980, pp. 809-814.
Ghandi, "VLSI Fabrication Principles", John Wiley & Sons, NY, 1983, pp. 448-451.
H. Ito et al., a-Si:H TFT Array Driven Linear Image Sensor with Capacitance Coupling Isolation Structure, Dec. 1-4, 1985, pp. 436-439, Technical Digest.
T. Ozawa et al., Design and Evaluation of A4 Amorphous Si Hybrid Image Sensor, May 24-26, 1982, pp. 132-137, Proceedings of the 1982 International Microelectronics Conference.

Primary Examiner—Brian E. Hearn
Assistant Examiner—Beverly A. Pawlikowski
Attorney, Agent, or Firm—Welsh & Katz, Ltd.

[57] ABSTRACT

A method for fabricating a thin-film transistor having a stagger structure, in which the inner portion of the amorphous silicon layer doped as an ohmic contact layer to source and drain areas is defined by an insulating layer interposed therebetween, a step for forming source and drain electrodes on said amorphous silicon layer, which comprises a film forming process for forming a metal layer; a thermal treatment process for heating so as to generate a surface reaction between said metal layer and said amorphous silicon layer in order to selectively form a reaction layer only on said amorphous silicon layer; and a patterning process for selectively removing said metal layer so as to form source and drain electrodes.

5 Claims, 3 Drawing Sheets

METHOD OF FABRICATING A THIN FILM TRANSISTOR

BACKGROUND OF THE INVENTION

1. Field of the Invention

This invention relates to a method of fabricating a thin film transistor, and more particularly to a method of fabricating a thin film transistor of stagger structure.

2. Description of the Related Art

A thin film transistor using a thin film such as an amorphous silicon thin film, etc. as a semiconductor layer has attracted attention recently. For example, a plurality of transistors is integrated two dimensionally on a large, inexpensive substrate, such as glass, so as to form an active matrix which is combined with liquid crystal so as to form a panel display.

A stagger structure is given as a typical example of an embodiment of the structure of a conventional thin film transistor. FIG. 2 shows a stagger structure in which a gate electrode is provided at the side opposite to source and drain electrodes with respect to a semiconductive active layer.

For instance, a thin film transistor of the stagger structure is fabricated by successively forming on a glass substrate 101 an electrode 102, a gate insulating layer 103, an amorphous silicon i layer as an active semiconductor layer 104 an amorphous silicon n+ layer 105 as an ohmic contact (formation) layer, a source electrode 106 and a drain electrode 107.

In this configuration, however, the following problem are likely to occur. When the inner ends of the source and drain electrodes terminate outside of the ends of the gate electrode, an unchanneled portion is produced, whereby the transistor is held off. When the inner ends of the source and drain electrodes extend inside the end of the gate electrode, the source and drain electrodes, overlap the gate electrode thereby increasing connection capacity and lowering response speed.

Accordingly, it is to be desired that the inner ends of the source and drain electrodes be aligned with the end of the gate electrode in executing the patterning of the source electrode and the drain electrode. Thus, mask alignment requires high accuracy.

To obviate the aforementioned problem, the inventor of this invention proposed the following configuration for the purpose of providing a thin film transistor in which high accuracy mask alignment is not required and incidental capacity caused by the overlapping between the gate electrode and the source and drain electrodes is decreased so as to increase responsive speed. This is disclosed in my Japanese patent application No. 261518/1984, which was published on June 26, 1986 as Japanese Laid-open patent application No. 61-139069.

FIG. 3 shows such a thin-film transistor in which an amorphous silicon n+ layer (ohmic contact forming layer) corresponding to the source and drain areas is defined by an upper insulating layer interposed therebetween and it is configurated such that the inner ends of the source and drain areas are aligned with the ends of the gate electrode.

FIGS. 4(a) through 4(f) show an example of the process for forming the thin film transistor of FIG. 3 as disclosed in my Japanese Laid-open patent application No. 61-139069. In FIG. 4(a), a gate electrode 202 made of a chrome layer is patterned on a transparent glass substrate 201, and thereafter a silicon dioxide layer or silicon nitride layer is formed as a gate insulating layer 203.

Thereafter, amorphous silicon i layer 204 is formed as a semiconductor active layer as shown in FIG. 4(b).

Then, after the silicon dioxide layer or silicon nitride layer 206 is deposited, light is exposed from the substrate side under the state in which posi-resist 209 is coated as shown in FIG. 4(c), so that an image G of the gate electrode 202 is formed in the posi-resist 209.

Subsequently, after the development of the posi-resist 209 and the etching of the silicon dioxide layer or silicon nitride layer, the posi-resist pattern 209 and the upper insulating layer 206 are formed as shown in FIG. 4(d).

Furthermore, as shown in FIG. 4(e), an amorphous silicon n+ layer 205 is formed as an ohmic contact formation layer, and a thin chrome layer 208' is formed as a layer for forming the source and drain electrodes.

Thereafter, the amorphous silicon n+ layer 205 and the thin chrome layer 208' on the upper insulating layer 206, that is, the gate electrode 202, are removed by means of a lift off method, so that the ohmic contact formation layer 205 and source and drain electrodes 207 and 208 are patterned so as to form aluminum layer 210' as the wiring of the source and drain electrodes as shown in FIG. 4(f).

And finally, patterning is executed by means of the photo-lithography method so as to remove the outer edges of the ohmic contact layer and semiconductor active layer (FIG. 3).

The reason why the source and drain electrodes 207 and 208, and the electrode interconnection layer 210 are formed in the separate processes are as follows. In the patterning process by means of the lift-off method, patterning can be carried out only for a film sufficiently thinner than the resist pattern. In order to lift off the chrome layer and the amorphous silicon n+ layer concurrently, the chrome layer must be thin. As the source and drain electrode, a considerably thin layer may be used. However, when the interconnection layer is long, as resistance increases, considerable thickness is needed. Thus, the method above-described is usually adopted.

However, in this method, the formation of the source and drain electrodes (and the interconnection layer) requires a double use of metal film formation processes. Therefore, the steps are increased, and working efficiency is decreased.

SUMMARY OF THE INVENTION

The object of the present invention is to reduce the number of steps in the manufacture of a thin film transistor so as to facilitate the fabrication of the transistor.

According to this invention, the inner edges of a doped amorphous silicon layer which is formed on an amorphous silicon i layer corresponding to the source and drain areas is defined by the upper insulating layer interposed therebetween. In a process of stagger-structured thin film transistor of the configuration such that the inner edges of the source and drain areas align with the edges of the gate electrode, the formation process of source and drain electrodes includes a metal layer forming process, a thermal treatment process for heating in order to form a reactive layer (metal diffusion layer) on the surface of the amorphous silicon layer, and a patterning process for selectively removing the metal layer by means of photo-lithography methods so as to execute patterning.

The inventor of the present invention discovered that in manufacturing a thin film transistor, a metal-silicon reaction layer is not dissolved by an etchant used in the patterning process of the metal layer, and the metal-silicon reaction layer is conductive. This discovery led to the present invention.

In a method of fabricating a thin film transistor according to this invention, a gate electrode, a gate insulating layer and an amorphous silicon i layer (semiconductive active layer) are sequentially formed on a transparent substrate by means of a conventional method.

Subsequently, an upper insulating layer is formed on the amorphous silicon i layer, and a positype-resist is coated on the upper surface of the insulating layer, and thereafter an image formed by the gate electrode is focused on the positype-resist by exposing light from the substrate side. Thus, an upper insulating layer pattern is formed by means of self-alignment.

With the positype-resist pattern being retained, an amorphous silicon n+ layer is formed on the upper insulating layer, and the amorphous silicon n+ layer on the upper insulating layer as well as positype-resist pattern are then removed by the lift-off method.

Consequently, an electrode metal layer is formed in a predetermined thickness, and a surface reaction is generated only between the lowest layer and the amorphous silicon n+ layer as well as between the amorphous silicon n+ layer and the electrode metal layer by thermal treatment so as to form a metal diffusion layer of metal-silicon. During the treatment, surface reaction does not occur on the upper insulating layer.

And finally, the electrode metal layer is selectively removed by an ordinary photo-lithography process so as to execute patterning of the source and drain electrodes. During the process, the metal diffusion layer of metal-silicon remains on the surface of the amorphous silicon n+ layer without being deteriorated by the etching solution of the electrode metal layer, thereby forming a thin low resistance layer substantially the same as that actually formed by the lift-off method. Thus, even if the source and drain electrodes are apart from the channel portion, the resistance between the electrode and the channel portion is made considerably low.

As described above, prior to the patterning of the source and drain electrodes, by generating surface reaction between the amorphous silicon n+ layer and the electrode metal layer by the heat treatment, and by forming an insoluble metal-silicon layer only on the surface of the amorphous silicon n+ layer, the number of steps for forming the film do not increase so that the film is made very easily and the same effect as that formed by the lift-off method, as is shown in the conventional method, can be achieved.

Further, surface reaction is generated between an ohmic contact layer and a metal layer so that may be made a low resistance layer unnecessary to patterning by producing surface reaction between the ohmic contact layer metal film by executing thermal treatment prior to the patterning after the metal layer is formed when forming source and drain electrodes of thin film transistor in which an ohmic contact layer to source and drain areas is formed, such that an insulating layer is interposed therebetween. Accordingly, a highly reliable thin film transistor is obtained in which a thin low resistive layer is formed with contact with the ohmic contact layer easily and with high efficiency by only one metal film formation process.

DESCRIPTION OF THE PREFERRED EMBODIMENT

FIGS. 1(a) through 1(h) are views showing an embodiment of the fabrication steps for producing a thin film transistor according to this invention.

First of all, a chrome layer is deposited on a transparent glass substrate 1, and thereafter patterning is executed thereon by a photo-litho etching method so as to form a gate electrode 2.

Figure 1A:
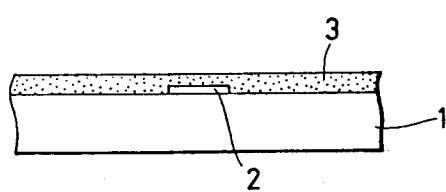
FIGS. 1(a) through 1(h) are views showing the steps for fabricating a thin film transistor according to an embodiment of this invention.

Then, a silicon dioxide layer is formed as a gate insulating layer 3 by a plasma CVD method as shown in FIG. 1(a).

Figure 1B:
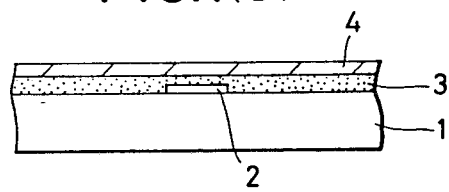

Thereafter, a amorphous silicon i layer 4 having a thickness ranging from 100 to 1000 Å is formed by a high frequency glow discharge method for resolving monosilan ($SiH_4$) as shown in FIG. 1(b).

Figure 1C:
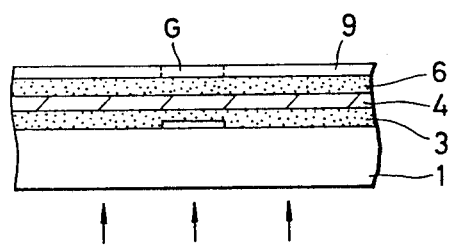

Subsequently, a polyamide layer is formed as an upper insulating layer 6 as shown in FIG. 1(c) and the positype-resist layer 9 (e.g. OFPR 800 (trademark) made by Tokyo Ohyo Kagaku Kogyo) is coated thereon, and thereafter, light is transmitted from the substrate underside so as to focus an image G of the gate electrode 2 in the positype-resist 9.

Figure 1D:
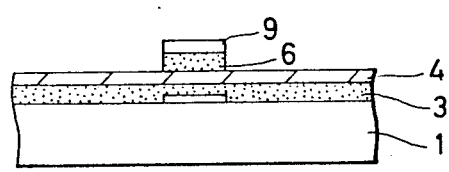

Then, the positype-resist 9 is developed, the polyamide layer is made through patterning such that the positype-resist pattern 9 acts as a mask so that the upper insulating layer 6 is formed as shown in FIG. 1(d).

Figure 1E:
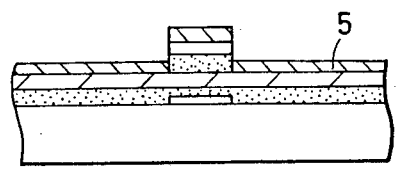

Thereafter, while the positype-resist pattern 9 is retained on the upper insulating layer 6, an amorphous silicon n+ layer 5 having a thickness of about 600 Å is deposited by a high frequency wave glow discharge monosilane dissolution method as shown in FIG. 1(e). At this time, phosphor ($PH_3$) is used as a doping gas.

Figure 1F:
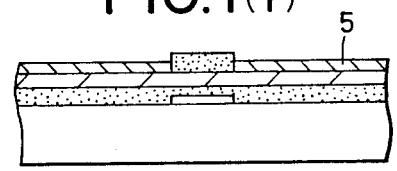

Subsequently, the amorphous silicon n+ layer positioned on the pattern 9 is selectively removed together with the positype-resist pattern 9 by the lift-off method (FIG. 1(f)).

Figure 1G:
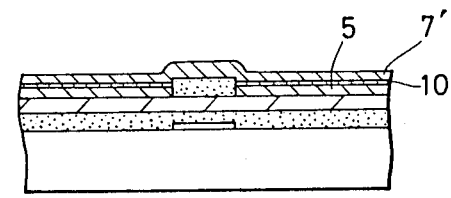

Thereafter, aluminum deposition layer 7' having a thickness of 1 μm is formed by vapor deposition, and then thermal treatment is conducted for about 30 minutes at about 200° C. so as to form an aluminum-silicon (Al-Si) layer 10 only in the contact surface with the amorphous silicon n+ layer 5 as shown in FIG. 1(g).

Figure 1H:
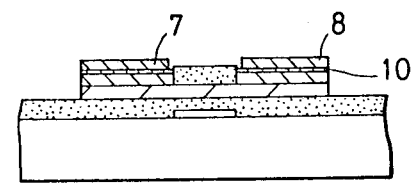
Figure 2:
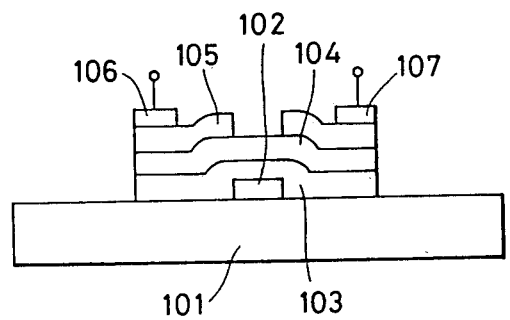
FIG. 2 is a view showing the configuration of a conventional thin film transistor having a stagger structure.
Figure 3:
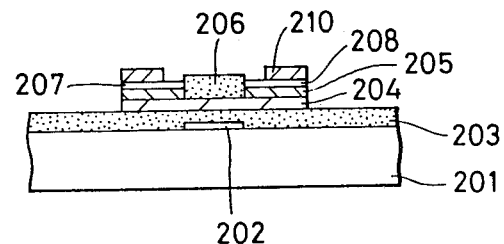
FIG. 3 is a view showing a modification of the conventional thin film transistor.
Figure 4A:
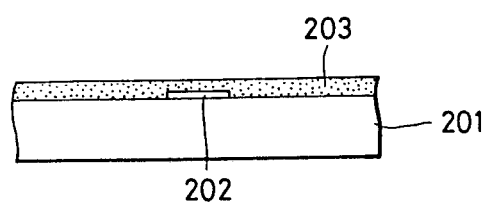
FIGS. 4(a) through 4(f) are views showing fabrication steps of the modified thin film transistor in FIG. 3.
Figure 4B:
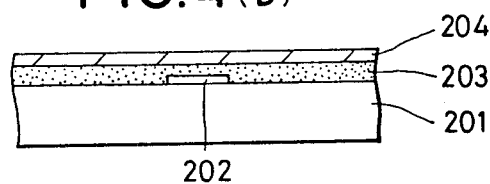
Figure 4C:
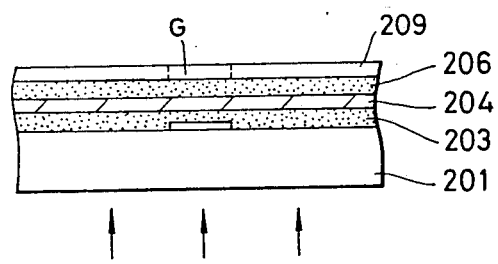
Figure 4D:
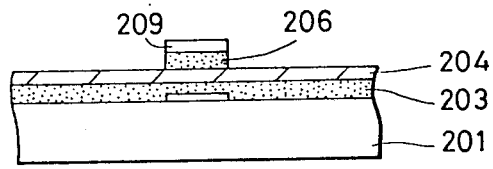
Figure 4E:
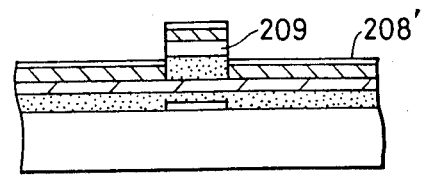
Figure 4F:
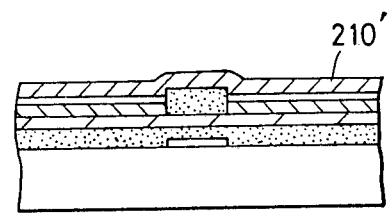

Finally, aluminum deposition layer 7' is patterned by a photo-litho etching method as shown in FIG. 1(h), to form source and drain electrodes 7 and 8 by removing the interconnection between layers 7 and 8 and the outer peripheral edges of the amorphous silicon i layer, amorphous silicon n+ layer, and Al-Si the layer by etching.

According to the foregoing method, the gate electrode and the source and drain electrodes do not overlap so that a thin-film transistor having swift response is easily formed without carrying out high accurate mask alignment.

Furthermore, it becomes unnecessary to form a thin contact (metal) layer of the source and drain electrode by lift-off method, thereby reducing the number of the processing steps.

At this time, since low resistance Al-Si layers are aligned, though there is a fine space between the source and drain electrodes 7 and 8 and the channel portion, the resistance of source and drain electrode and the channel portion is maintained considerably low.

According to this embodiment, aluminum is used as a metal layer for forming source and drain electrodes. However, the metal is not limited to aluminum but gold (Au), Chrome (Cr), Nickel (Ni), Tungsten (W), molybdenum (Mo), or other materials can be also used. Among these materials, it is preferable that a material which reacts with silicon at a low temperature be used. The temperature set at thermal-treatment should be preferably selected corresponding to the substrate used as a metal layer. For example, when gold is used, the temperature and time are set to about 200° C. and about 30 minutes, and they are set at about 250° C. through about 300° C. for chrome.

In addition to using Chrome as the gate electrode, Nickel (Ni), Molybdenum (Mo), or Tungsten (W) can be used as a material for the gate electrode.

Furthermore, in addition to using polyamide as the upper insulating layer, a silicon dioxide layer, etc. can be used as an upper insulating layer.

What is claimed is:

1. A method for fabricating a stagger type thin film transistor in which inner ends of a highly doped amorphous silicon layer as an ohmic contact layer provide source and drain areas which are defined by an upper insulating layer interposed between the source area and the drain areas, comprising the steps of:
   (a) forming a gate electrode on a transparent substrate;
   (b) depositing a lower insulating layer over said gate electrode and said transparent substrate;
   (c) depositing an amorphous silicon layer on said lower insulating area;
   (d) depositing an upper insulating layer on said amorphous silicon layer;
   (e) coating a posi-type resist layer on said upper insulating layer;
   (f) exposing said posi-type resist layer to light passing through from the underside of said trasparent substrate and developing said posi-type resist layer to retain a resist pattern at the position corresponding to said gate electrode;
   (g) patterning said upper insulating layer using said resist pattern as the mask;
   (h) depositing a highly doped amorphous silicon layer as an ohmic contact layer on said resist pattern and said amorphous silicon layer, and patterning said highly doped amorphous silicon layer by a lift-off method to remove said resist pattern;
   (i) depositing a metal layer on a said patterned upper insulating layer and said patterned amorphous silicon layer;
   (j) heating said highly doped amorphous silicon layer and said metal layer to generate a surface reaction between said metal layer and said highly doped amorphous silicon layer in order to selectively form a thin reaction layer therebetween; and
   (k) patterning said metal layer to form source and drain electrodes on each side of said patterned insulating layer while retaining said reaction layer by selectively etching away by a photolithography method that portion of said metal layer which has not reacted with an underlying layer and which remains on an area where said highly doped amorphous silicon layer is not present.

2. The method set forth in claim 1 wherein said heating process is carried out at a temperature in the range of from about 200° C. to about 300° C.

3. The method set forth in claim 1 wherein said metal layer is made of aluminum and said reactive layer is made of aluminum-silicon.

4. The method set forth in claim 1 wherein said metal layer is made of gold and said reactive layer is made of gold-silicon.

5. The method set forth in claim 1 wherein said heating process is carried out for about 30 minutes at a temperature of about 200° C.

* * * * *